(12) United States Patent
Ahmad et al.

(10) Patent No.: US 8,949,645 B2
(45) Date of Patent: Feb. 3, 2015

(54) POWER DISTRIBUTION FOR MICROPROCESSOR POWER GATES

(75) Inventors: Sagheer Ahmad, Cupertino, CA (US); Tezaswi Raja, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 297 days.

(21) Appl. No.: 13/357,352

(22) Filed: Jan. 24, 2012

(65) Prior Publication Data

US 2013/0191656 A1   Jul. 25, 2013

(51) Int. Cl.
*G06F 1/26* (2006.01)
*G06F 1/18* (2006.01)

(52) U.S. Cl.
CPC ..................... *G06F 1/189* (2013.01)
USPC ........................... 713/330; 713/300

(58) Field of Classification Search
CPC ........................................ G06F 1/189
USPC .................................. 713/300, 330
See application file for complete search history.

(56) References Cited

U.S. PATENT DOCUMENTS

| | | |
|---|---|---|
| 2005/0218943 A1 | 10/2005 | Padhye et al. |
| 2008/0307244 A1 | 12/2008 | Bertelsen et al. |
| 2010/0231044 A1 | 9/2010 | Tatsumi et al. |
| 2011/0205680 A1* | 8/2011 | Kidd et al. ............ 361/93.2 |
| 2011/0314314 A1* | 12/2011 | Sengupta ................ 713/323 |
| 2013/0158892 A1* | 6/2013 | Heron et al. ............. 702/34 |

* cited by examiner

*Primary Examiner* — Albert Wang (57) ABSTRACT

Embodiments related to controlling power distribution within a microprocessor are provided. In one example, a microprocessor comprising a power supply is provided. The example microprocessor also includes a plurality of power gate zones configured to receive power from the power supply, each power gate zone including a plurality of power gates, where the power gates within any given one of the power gate zones are controlled by the microprocessor independently of its control of power gates within any other of the power gate zones. The example microprocessor is operative to cause power initially to be supplied to a first power gate in a first one of the power gate zones, power then to be supplied to a second power gate in a second one of the power gate zones, and power then to be supplied to a third power gate in the first one of the power gate zones.

19 Claims, 5 Drawing Sheets

POWER DISTRIBUTION FOR MICROPROCESSOR POWER GATES

BACKGROUND

Controlling power distribution within a microprocessor can be difficult. For example, transient currents initially supplied to gates when first powering the microprocessor may be experienced as a high current, low load condition. Such conditions may cause damage to the gates and/or to the wires connecting the transistor to downstream devices.

DETAILED DESCRIPTION

Figure 1:
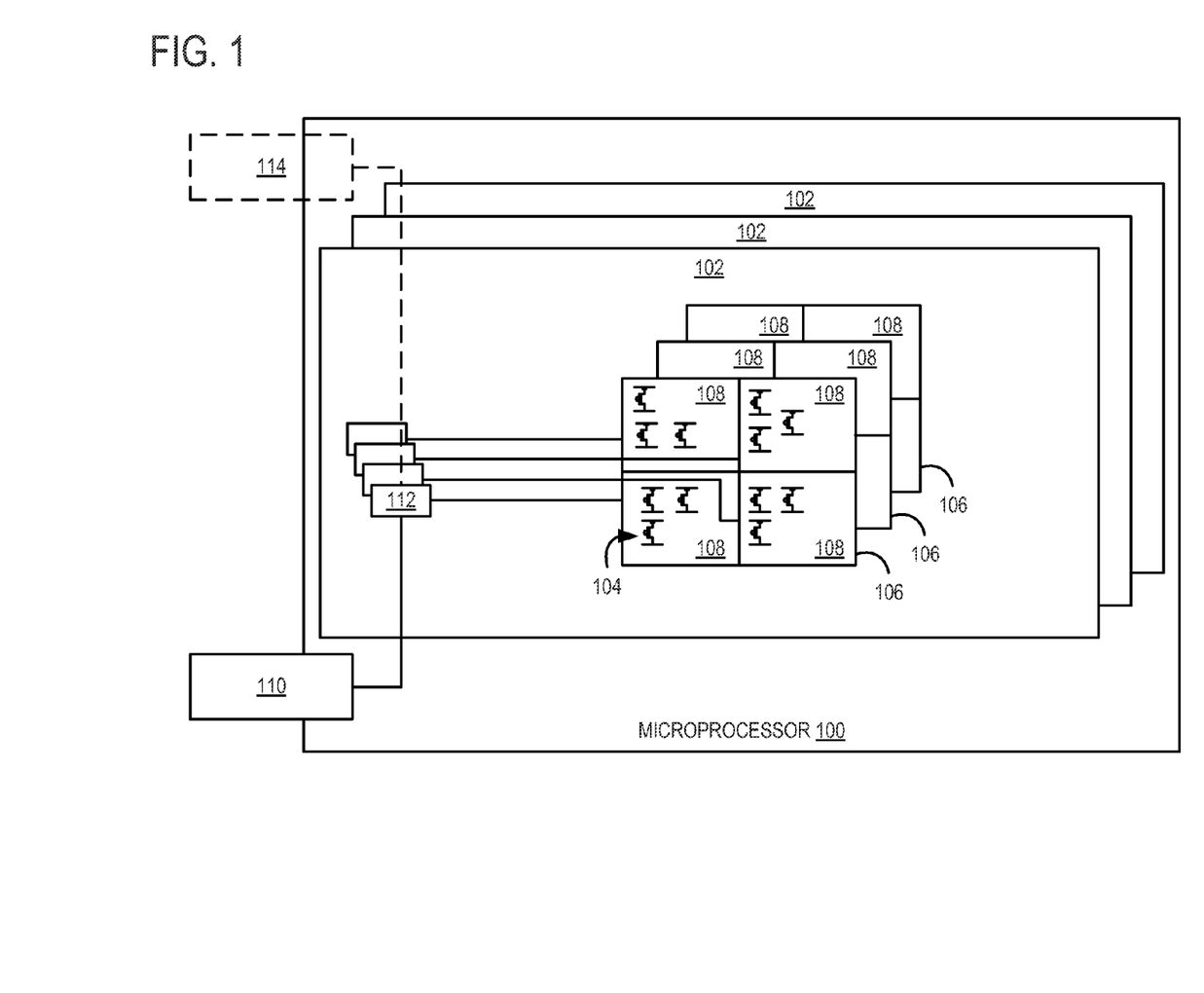
FIG. 1 schematically shows a microprocessor according to an embodiment of the present disclosure.

FIG. 1 schematically shows an embodiment of a microprocessor 100 comprising two or more processing cores. Microprocessor 100 is divided into a plurality of partitions 102. Partitions 102 are configured to manage different cores and/or applications within microprocessor 100, each partition 102 configured to manage a different core of microprocessor 100. In some settings, use of partitions 102 may result in more efficient use of processing resources within microprocessor 100.

It will be appreciated that partitions 102 may be powered on and/or off according to various processing and/or application situations experienced by microprocessor 100. For example, one or more partitions 102 may experience a wake-up event in response to an application or a process call for execution elements present within those partitions 102. When processing is complete, those partitions 102 may experience a sleep event, which may conserve power consumption and/or reduce thermal output at the microprocessor. Non-limiting examples of wake-up events include cold boots, real timer clock (RTC) events, user key press events, and the like.

If not carefully managed, powering partition 102 in response to wake-up events may produce uneven and undesirable strain on power gates within partition 102. This condition places a strain on the power gate and the components downstream of the power gates that are activated upon wake-up. Traditionally, the repeated wake-up related stress at the power gate may cause damage to the transistors and other components that are activated. For example, transient current initially supplied to power gates 104 may be experienced as a high current, low load condition. Such conditions may occur repeatedly; traditionally, they typically occur at the same power gates every time a wake-up event occurs, potentially causing damage to the transistor and/or to the wires connecting the transistor to downstream devices. For example, such stress may result in the electromigration of metal layer material into surrounding dielectric material. This may lead to potential breakdown of the dielectric material over time may cause increased resistance in the supply voltage to the gate. Other potential defects may manifest as shorts and/or opens within devices electrically connected to power gate 104. Alternatively, bottlenecking the wake-up of a partition through a few power gates to limit device damage may extend turn-on time for the partition and delay the availability of the microprocessor resources, possibly reducing potential efficiency and/or utilization gains that may be realized by microprocessor partitioning.

Accordingly, the disclosed embodiments relate to staged introduction of power to power gates within a partition of a microprocessor. Such staged introduction may be implemented so that the wear/strain applied during wake-up may be distributed over a potentially larger number of power gates. Depending on the application, power introduction may be staged across different power gates during temporally different wake-up conditions and/or during the same wake-up condition.

In some embodiments, the disclosed power gates may be arranged in power gate zones within a partition, which may be used to stage power introduction to a partition in a single wake-up condition. During an example wake-up condition, power may be supplied to a power gate in a first power gate zone, then to a power gate in another power gate zone, then to another power gate in the first power gate zone. Such staged distribution of power delivery to multiple different power gates during a wake-up condition may avoid the potential device damage described above and, in some settings, may provide a desired turn-on time for the partition, possibly realizing potential efficiency and/or utilization gains that may be achieved by microprocessor partitioning.

In some embodiments, the disclosed power gates may be arranged in power gate groups within such power gate zones, which may be used to stage power introduction to different power gates in a partition over the course of two or more wake-up conditions. The microprocessor may then control power delivery so that power is provided to a first power gate group upon a first wake-up condition at the microprocessor, and, upon a second wake-up condition at the microprocessor, power is provided to a second power gate group before providing power to the first power gate group.

The following scenario may help illustrate how power might be staged to different power gates over the course of two wake-up conditions. During a first wake-up condition at time T0, the staged power activation may occur at a first group of power gates, which may span more than one power gate zone. During a subsequent wake-up condition at time T1, the wake-up strategy may involve a different group of power gates that span the same or different power gate zones. Accordingly, the staged nature of wake-up and use of different power gates allocates the wear/strain across a much larger number of power gates, thereby reducing the likelihood that any one gate may fail or be damaged as a result of the above-described strain. Furthermore, even if a failure arises, the time interval before such a failure occurs may be much longer than in prior regimes.

In the example shown in FIG. 1, power gates 104 within partition 102 are divided among a plurality of power gate zones 106. It will be appreciated that power gates 104 within each power gate zone 106 may be distributed in any suitable manner throughout any given partition 102 without departing from the scope of the present disclosure. In some embodiments, a plurality of power gate zones 106 may be overlaid with one another, while in some other embodiments, a plurality of power gate zones 106 may be arranged as non-overlapping tiles.

It will be appreciated that any given power gate zone 106 may include any suitable number of power gates 104. Further, it will be appreciated that one power gate zone 106 within any given partition 102 may include more or less or the same number of power gates as any other power gate zone 106 within that partition 102. For example, in some embodiments, power gates 104 within a partition 102 may be divided into power gate zones 106. Those power gate zones 106 that are turned on earlier during a wake-up condition may include different numbers of power gates 104, while some other power gate zones 106 that are turned on later during the wake-up condition may include approximately the same number of power gates 104. Dividing power gates 104 in such a manner may potentially reduce in-rush current during the earlier portion of the wake-up condition while potentially expediting partition turn-on during the later portion of the wake-up condition.

Figure 2:
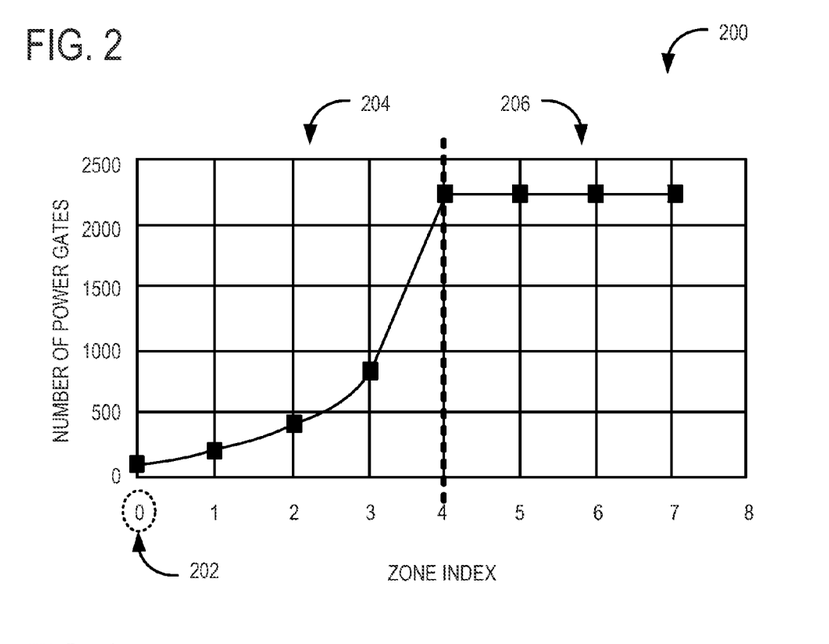
FIG. 2 shows a graph depicting a division of power gates within power gate zones in a microprocessor according to an embodiment of the present disclosure.

As an example, FIG. 2 shows a graph 200 depicting a division of power gates within power gate zones (as identified by zone index 202) in an embodiment of a microprocessor. Graph 200 is divided into two regions. Early power gate zone region 204 represents power gate zones that may be turned on early in the wake-up condition. Late power gate zone region 206 represents power gate zones that may be turned on late in the wake-up condition, after power gate zones in early power gate zone region 204 are turned on. In some embodiments, power gate zones may be powered on sequentially in order of increasing zone index. For example, in the embodiment shown in FIG. 2, zone 0 may be supplied power before zone 1, and so on, so that zone 7 is the last zone to receive power.

In the graph shown in FIG. 2, zones 0 through 3 are included in early power gate zone region 204. Each of zones 0 through 3 includes a different number of power gates. More specifically, zones 0 through 3 are configured to include an increasing number of power gates so that, as the power gate zones are powered on in an increasing sequence from zone 0 to zone 3, an increasing number of power gates receive power. Consequently, voltage across the power gates in those zones may decrease with increasing zone index even though the voltage supplied to the partition may increase as power is supplied to more and more power gates within the partition.

It will be appreciated that any suitable distribution of power gates may be employed within early power gate zone region 204 within embodiments so configured. In the example shown in FIG. 2, early power gate zone region 204 is configured so that the power gates within zones 0 through 3 are distributed in an approximately exponentially increasing arrangement. As shown in FIG. 2, zone 0 includes approximately 1% of the power gates within the partition, zone 1 includes approximately 2% of the power gates within the partition, zone 2 includes approximately 3% of the power gates within the partition, and zone 3 includes approximately 8% of the power gates within the partition.

In contrast, a power gate zone included in late power gate zone region 206 may be characterized as having approximately the same number of power gates (within an acceptable tolerance) as other power gate zones within region 206. By dividing the power gates equally among the power gate zones within late power gate zone 206, power may be rapidly supplied to the partition, potentially improving efficiency in partition wake-up. In the example shown in FIG. 2, each of the power gate zones 4 through 7 illustrated in late power gate zone region 206 include approximately 21% of the power gates within the partition. Thus, in some embodiments, a number of power gates included in late power gate zone region 206 may exceed a number of power gates included in early power gate zone region 204.

It will be appreciated that the percentages presented for the non-limiting example described above are approximate in nature and are provided for illustrative purposes only, and that some rounding discrepancies may be present in the example for the sake of clarity. Nevertheless, when added together, the number of power gates included in early power gate zone region 204 and late power gate zone region 206 represent all of the power gates within a given partition.

In some embodiments, one or more of the power gate zones 106 may be divided into a plurality of power gate groups 108. Dividing power gates zones 106 into a suitable number of power gate groups 108 may allow transient power delivery stress during a wake-up condition to be distributed selectively across a plurality of power gate zones 106, as explained in more detail below with respect to FIGS. 3 and 4A-4B. Dividing power gates zones 106 into power gate groups 108 may also allow transient power delivery stresses to be distributed selectively across a plurality of wake-up conditions, as explained in more detail below with respect to FIG. 5.

It will be appreciated that, in embodiments where one or more power gate zones 106 are divided into power gate groups 108, power gate zones 106 may be divided into any suitable number of power gate groups 108 without departing from the scope of the present disclosure. In the example shown in FIG. 1, each power gate zone 106 is depicted as being divided into four power gate groups 108. Further, while the examples described herein generally refer to power gate zones 106 that have been divided into the same number of power gate groups 108 (e.g., all power gate zones 106 being divided into the same number of power gate groups 108), it will be appreciated that in some embodiments, some power gate zones 106 may be divided into a different number of power gate groups 108 than some other power gate zones 106. Likewise, in some embodiments, some power gate zones 106 may be divided into power gate groups 108 while some other power gate zones 106 may not be divided into power gate groups 108 at all.

As introduced above, power delivery to power gates 104 from a power supply 110 within any given one of the power gate zones 106 and/or power gate groups 108 is controlled by microprocessor 100 independently of the microprocessor's control of power gates 104 within any other power gate zone 106 and/or power gate group 108, respectively. In some embodiments, power supply 110 may be configured to provide between 0.5 and 1.4 V and between 100 and 5000 mA to power gates 104 in microprocessor 100.

It will be appreciated that any suitable manner of controlling power delivery to power gates 104 from power supply 110 may be employed by microprocessor 100. For example, in some embodiments, microprocessor 100 may control power gates 104 within a power gate group 108 using a power controller 112. In such embodiments, power controller 112 may be independent of any other power gate group 108 within a particular partition 102, so that each power gate group 108 is independently controlled by an individualized power controller 112. For example, in the embodiment shown in FIG. 1, each power gate group 108 is electrically coupled to an independent power controller 112, though only power controllers 112 electrically connected to power gate groups 108 included in Zone 0 are shown for clarity. Alternatively, in some embodiments, microprocessor 100 may control power gates 104 at the power gate zone level or at any other suitable level without departing from the scope of the present disclosure. Thus, power delivery from power supply 110 may be controlled by microprocessor 100 at the power gate group level, the power gate zone level, or any other suitable level. In turn, power delivery may be managed according to virtually any microprocessor partitioning scheme.

In some embodiments, microprocessor 100 may include memory 114 operatively connected with power controllers 112 for storing identification information about the various partitions 102, power gate zones 106, and power gate groups 108. For example, in some embodiments, memory 114 may store zone and/or group index information, as described in more detail below. In some embodiments, memory 114 may be configured to retain the identification information even when one or more partitions 102 are unpowered. For example, in some embodiments, memory 114 may be "always-on," or continuously powered, so that memory 114 retains the identification information so long as microprocessor 100 is powered.

Figure 3:
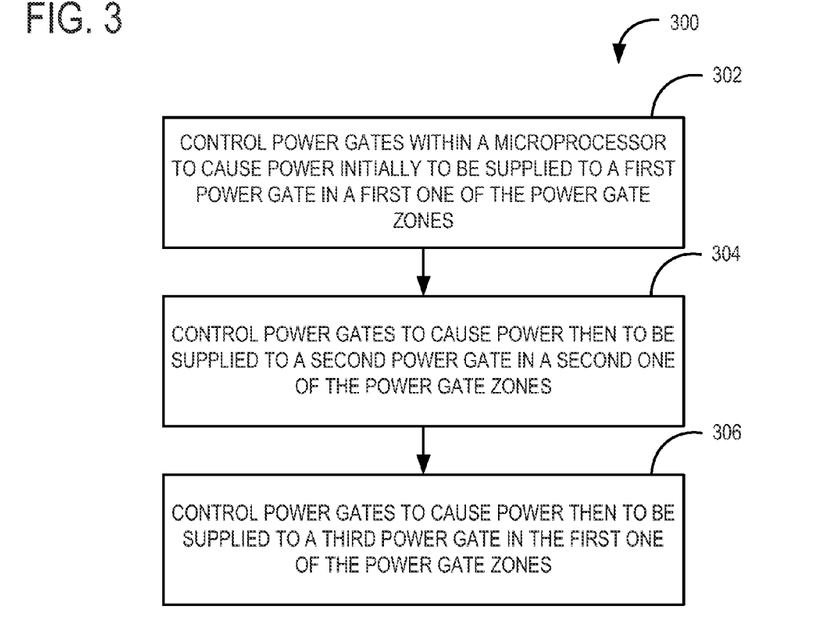
FIG. 3 shows a flow chart for a method of controlling power delivery to power gates within a microprocessor according to an embodiment of the present disclosure.

FIG. 3 shows a flowchart for an embodiment of a method 300 of controlling power delivery to power gates within a microprocessor, including but not limited to power gates within power gate groups and power gate zones in partitioned microprocessors such as those described above. Method 300 may be used, for example, to control the introduction of power to a partition of a microprocessor during a wake-up condition, potentially distributing and/or easing power supply load during a transient power-up event. It will be appreciated that method 300 may be used with any suitable hardware, including but not limited to the hardware disclosed herein.

At 302, method 300 includes controlling power gates within a microprocessor to cause power initially to be supplied to a first power gate in a first power gate zone. At 304, method 300 includes controlling the power gates to cause power then to be supplied to a second power gate in a second power gate zone. At 306, method 300 includes controlling the power gates to cause power to then be supplied to a third power gate in the first power gate zone. For example, in some embodiments, the microprocessor may control power distribution so that power is supplied to the second power gate before every power gate in the first power gate zone is powered. By staging power delivery via different power gate zones, the in-rush of current to a partition during a wake-up condition may be distributed to various power gates, potentially reducing repeated stresses to the same power gates.

Figure 4A:
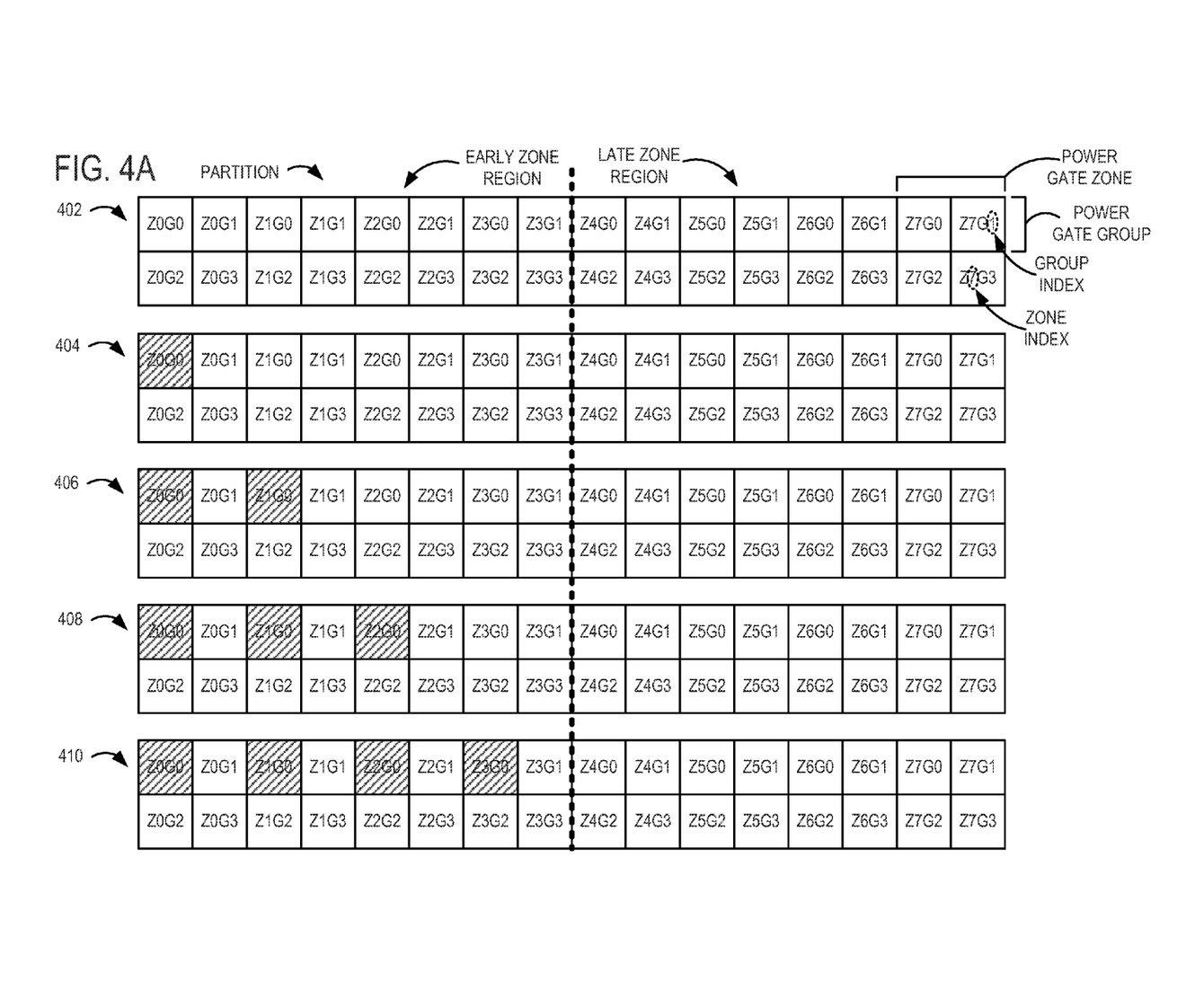
FIG. 4A schematically shows a method of controlling power delivery to power gate groups within a partition of a microprocessor according to an embodiment of the present disclosure.
Figure 4B:
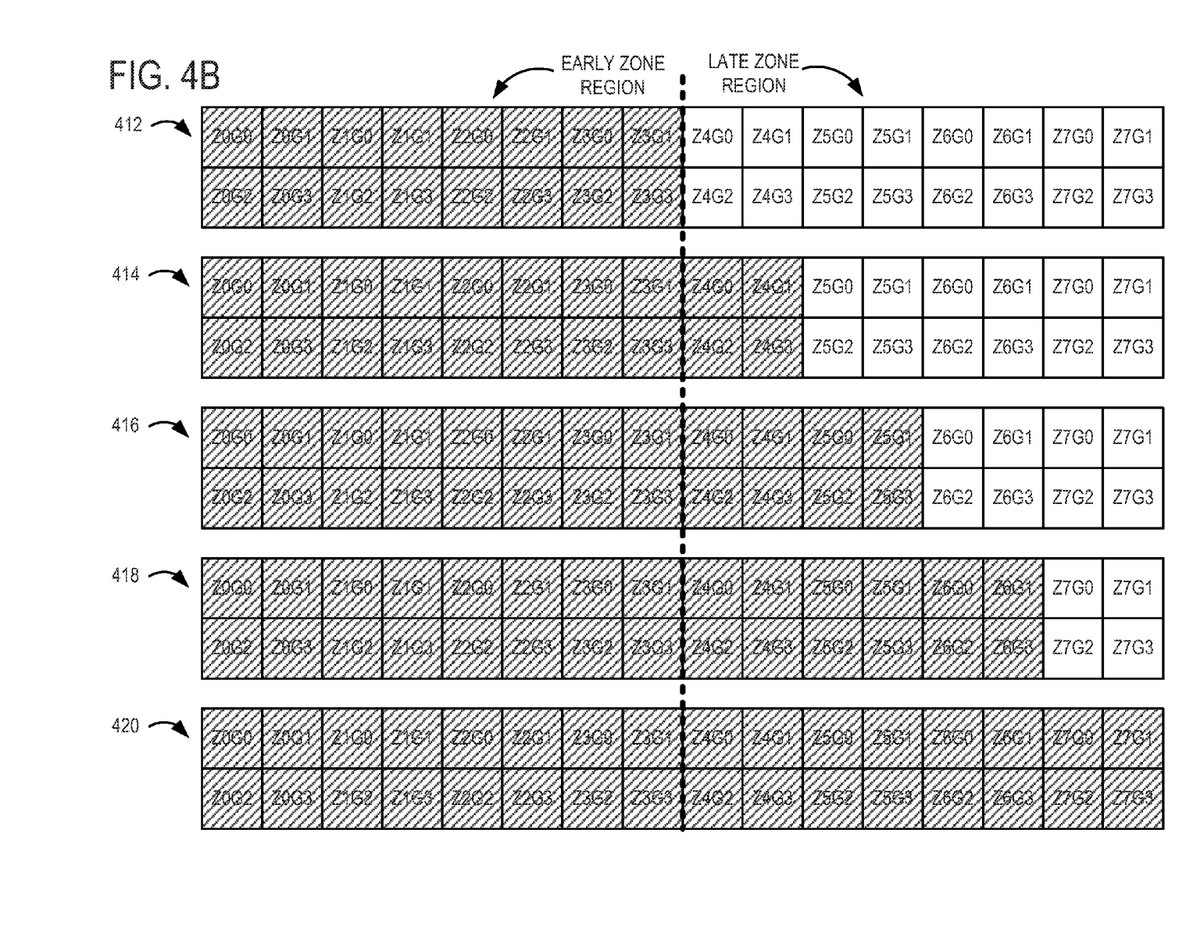
FIG. 4B schematically shows another portion of the method of controlling power delivery of FIG. 4A.

FIGS. 4A and 4B schematically depict a method 400 of power delivery to a partition during a wake-up condition according to an embodiment of method 300. In some embodiments, some of the processes illustrated in the example method 400 depicted in FIGS. 4A and 4B and described herein may be rearranged in alternate orders, including parallel and/or other non-sequential orders. Further still, in some embodiments, some of the processes shown and described related to method 400 may be omitted. Accordingly, it will be appreciated that any suitable variation of method 400, including the variations described above, may be contemplated as being within the scope of the present disclosure.

FIGS. 4A and 4B depict the partition as being divided into eight zones and further shows each zone as being divided into four groups. However, it will be appreciated that the illustrated example is merely one non-limiting embodiment, and that any suitable division of power gates within the partition may be contemplated as being within the scope of the present disclosure. Additionally, the power gate zones and power gate groups depicted in FIGS. 4A and 4B are shown in a matrix-like arrangement for ease of illustration. However, it will be appreciated that any suitable arrangement of such zones and groups within partition may be employed without departing from the scope of the present disclosure. Each power gate group is identified using a zone index and a group index, so that any given power gate group may be distinctly identified within partition. Accordingly, it will be appreciated that, for a given partition, any particular zone index is different from any other zone index. Moreover, any particular group index is different from any other group index for a given power gate zone.

FIGS. 4A and 4B also depict an early power gate zone region and a late power gate zone region. Such power gate zone regions are optional, and may be omitted in some embodiments. However, it will be appreciated that some partition turn-on efficiency may be realized by including such power gate zone regions in some embodiments, as described in more detail below.

In some embodiments, the zone and group indices may be used to manage power delivery to the power gate groups. For example, zone and group indices may be tracked so that, for a given partition, power is first provided to selected power gates having the same group index, but according to a predetermined sequence of zone indices.

FIG. 4A depicts the partition in a powered-down state (e.g., before power is supplied to any power gates) at 402. At 404, power is supplied to power gates within power gate group Z0G0. In this state, power gates within power gate group Z0G0 may experience a maximum in-rush current. In some settings, the voltage across the power gates within power gate zone Z0G0 may be approximately 1000 mV, so that those power gates may experience a current flow of approximately 6.5 mA.

Once power has been supplied to power gates within power gate zone Z0, power may then be supplied to power gates within another power gate zone. Supplying power to power gates within another power gate zone before supplying power to additional power gates within the first power gate zone may allow the transient in-rush current stresses to be spread among a plurality of power gate zones. Thus, in the example shown in FIG. 4A, power is supplied to power gates in power gate group Z1G0 at 406. Next, power is supplied to power gates in power gate group Z2G0 at 408 and then to power gate group Z3G0 at 410.

Turning to FIG. 4B, power is supplied to power gate groups Z0G1, Z0G2, and Z0G3; Z1G1, Z1G2, and Z1G3; Z2G1, Z2G2, and Z2G3; and Z3G1, Z3G2, and Z3G3 at 412, so that all of the power gates within the early power gate zone region are powered at the end of process 412. The process of powering power gate groups Z(X)G1, Z(X)G2, and Z(X)G3, where X represents zone indices for early power gate zones, is depicted as occurring concurrently. Such a concurrent power-up process may save time during a wake-up condition. For example, in some embodiments, process 412 may take approximately 20 nanoseconds in 28 nanometer architecture. However, it will be appreciated that any sequential or non-sequential process may be employed without departing from the scope of the present disclosure.

At 414, method 400 includes supplying power to power gates included in late power gate zones in a zone-by-zone approach. For example, FIG. 4B depicts power being supplied concurrently to power gate groups within power gate zone 4 (e.g., Z4G0, Z4G1, Z4G2, and Z4G3) at 414; to power gate groups within power gate zone 5 (e.g., Z5G0, Z5G1, Z5G2, and Z5G3) at 416; to power gate groups within power gate zone 6 (e.g., Z6G0, Z6G1, Z6G2, and Z6G3) at 418; and to power gate groups within power gate zone 7 (e.g., Z7G0, Z7G1, Z7G2, and Z7G3) at 420. Zone-by-zone power-up may save time during partition wake-up. In some embodiments, powering up any of these zones may take approximately 20 ns in 28 nm architecture. Further, in some embodiments, once the early power gate zones are powered on, in-rush current may be reduced within the partition, potentially lowering stress on transistors in the late power gate zones as power is supplied to them. For example, in some embodiments, a partition having the all of the early power gate zones powered may exhibit a voltage across a power gate in a first zone of the late power gate zone to receive power of approximately 200 mV and a current through that power gate of less than approximately 1.5 mA.

Much as it will be appreciated that staging power delivery within a single wake-up condition may potentially reduce stress effects on transistors within a microprocessor, it will be appreciated that, in some embodiments, power delivery may be staged between successive wake-up events within the microprocessor.

Figure 5:
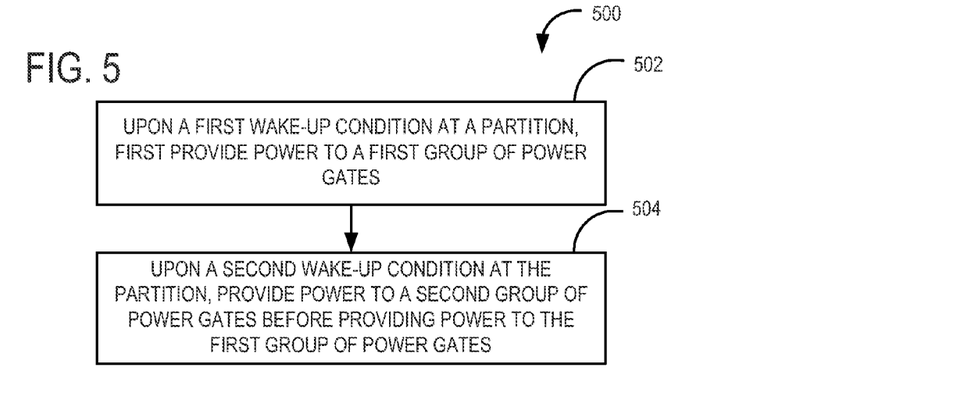
FIG. 5 shows a flow chart for a method of controlling power delivery to power gate groups within a partition of a microprocessor for different wake-up conditions according to an embodiment of the present disclosure FIG. 6 schematically shows method of controlling power delivery to power gate groups within a partition of a microprocessor for different wake-up conditions according to an embodiment of the present disclosure.

FIG. 5 shows a flow chart for an embodiment of a method 500 of controlling power delivery to power gate groups within a partition of a microprocessor for different wake-up conditions. At 502, method 500 includes, upon a first wake-up condition at a partition, providing power first to a first group of power gates. Next, method 500 includes, upon a second wake-up condition at the partition, providing power to a second group of power gates before providing power to the first group of power gates at 504. By staging the power delivery to a different group of power gates each time the partition is powered on, the stress applied to any given group of power gates may be reduced, as they do not experience an in-rush of current at every wake-up condition.

Figure 6:
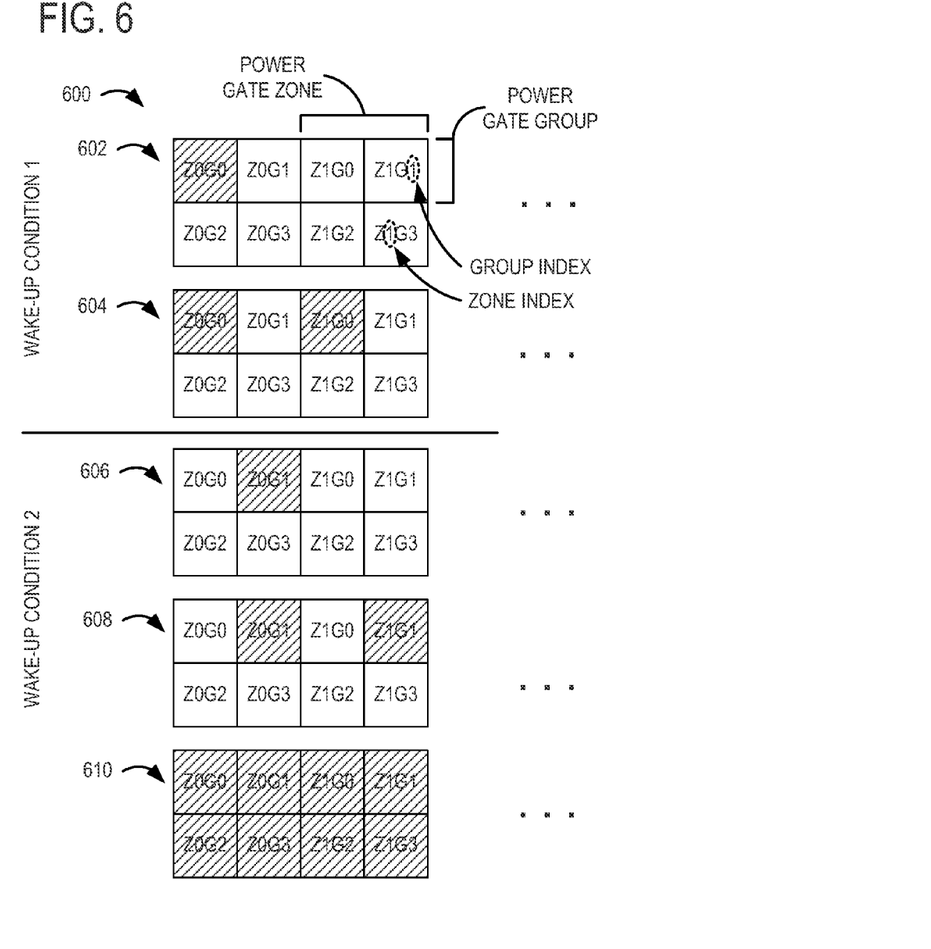

FIG. 6 schematically shows an embodiment of a method 600 of controlling power delivery to power gate groups according to method 500. FIG. 6 shows a portion of the partition shown in FIGS. 4A and 4B. Specifically, FIG. 6 depicts a portion of the early power gate zone region including power gate zones 0 and 1 illustrated in FIGS. 4A and 4B.

During the first wake-up condition at 602, power is initially supplied to power gate group Z0G0, and at 604, to power gate group Z1G0. Later, during a second wake-up condition at 606, power is initially supplied to power gate group Z0G1, and at 608, to power gate group Z1G1. It will be appreciated that power introduction may continue according to any suitable power delivery method, including the methods described herein, such as methods 300 and 400. For example, after power is supplied to power gate groups Z0G1 and Z1G1 during the second wake-up condition, power may be supplied to power gate groups Z2G1 and Z3G1 (not shown) before power is finally supplied to the remaining power gate zones in the early power gate zone region, including power gate group 0, as shown at 610.

It will be appreciated that any suitable manner of selecting the first and second groups of power gates may be employed without departing from the scope of the present disclosure. For example, in some embodiments, the power gate group selected to be powered on at the beginning of a wake-up condition may be selected based on a round-robin scheme. In such embodiments, a memory may be used to keep track of an identity of a previously-selected power gate group or a group index therefor, so that a power gate group chosen for a successive wake-up condition may be selected accordingly. In some of such embodiments, a suitable always-on memory may be employed to store suitable power gate group identity information. Tracking previously-selected power gate group identity information and selecting future power gate groups based on a known algorithm (such as a round-robin scheme, for example) may spread stress events to power gates within a partition, potentially reducing device damage.

In some embodiments, a power gate group selected to be powered on at the beginning of a wake-up condition may be chosen by a random or a pseudo-random process. Such embodiments may be employed without using a memory to track power gate group identity information. This may potentially save power and/or memory resources for the microprocessor.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples as understood by those of ordinary skill in the art. Such other examples are intended to be within the scope of the claims.

The invention claimed is:

1. A microprocessor, comprising:
a power supply; and
a plurality of power gate zones configured to receive power from the power supply, each power gate zone including a plurality of power gates, where the power gates within any given one of the power gate zones are controlled by the microprocessor independently of its control of power gates within any other of the power gate zones, and where the control by the microprocessor is operative to cause:
upon a first wake-up condition, power initially to be supplied to a first power gate in a first one of the power gate zones,
upon a second wake-up condition, power then to be supplied to a second power gate in a second one of the power gate zones, and
power then to be supplied to a third power gate in the first one of the power gate zones.

2. The microprocessor of claim 1, where the microprocessor is configured to supply power to the second power gate before every power gate in the first one of the power gate zones is powered.

3. The microprocessor of claim 2, further comprising a plurality of independent power controllers, each one of which is associated with and operative to control a different one of the plurality of power gate zones, where each power gate zone is divided into two or more power gate groups.

4. The microprocessor of claim 1, where each power gate zone is divided into a plurality of power gate groups.

5. The microprocessor of claim 1, where the first power gate group and the second power gate group are included in the same power gate zone.

6. The microprocessor of claim 1, further comprising memory for storing an identity of the first power gate group.

7. The microprocessor of claim 1, where the plurality of power gate zones includes one or more early power gate zones and one or more late power gate zones, where power is provided to at least one early power gate zone prior to being provided to at least one late power gate zone.

8. The microprocessor of claim 7, where a number of power gates included in the one or more late power gate zones exceeds a number of power gates included in the one or more early power gate zones.

9. A method for supplying power to power gates within a partition of a microprocessor, the method comprising:

dividing a plurality of power gates included in the microprocessor into a plurality of power gate groups;

upon a first wake-up condition at the partition of the microprocessor, first providing power to a first group of power gates; and upon a second wake-up condition at the partition of the microprocessor, first providing power to a second group of power gates before providing power to the first group of power gates.

10. The method of claim 9, where the partition is divided into a plurality of power gate zones, each power gate zone including two or more power gate groups, where the microprocessor controls power gates within a first one of the power gate zones independently of the microprocessor's control of power gates within any other power gate zone.

11. The method of claim 10, further comprising assigning each power gate of the plurality of power gates a zone index that is different from every other zone index and a group index that is different from every other group index for a given power gate zone.

12. The method of claim 11, where first providing power to the first group of power gates further comprises providing power to selected power gates having the same group index within the partition in a predetermined sequence according to the zone index for the selected power gates.

13. The method of claim 11, where each power gate zone further includes one or more early power gate zones and one or more late power gate zones, the early power gate zones being assigned zone indices that are lower than zone indices assigned to the late power gate zones.

14. The method of claim 13, further comprising, upon the first wake-up condition, providing power to a group of power gates included in a late power gate zone after first providing power to the first group of power gates by providing power to selected power gates having the same zone index in a predetermined sequence according to the group index for the selected power gates.

15. A microprocessor, comprising:

a power supply; and a plurality of power gates included in a partition of the microprocessor configured to receive power from the power supply, the plurality of power gates divided into a plurality of power gate groups, where the microprocessor is operative to control distribution of power to the plurality of power gate groups to cause:

power to be provided to a first power gate group upon a first wake-up condition at the partition of the microprocessor, and power to be provided to a second power gate group before providing power to the first power gate group upon a second wake-up condition at the partition of the microprocessor.

16. The microprocessor of claim 15, where the partition is divided into a plurality of power gate zones, each power gate zone including two or more power gate groups, and where each power gate of the plurality of power gates is assigned a zone index that is different from every other zone index and a group index that is different from every other group index for a particular power gate zone.

17. The microprocessor of claim 16, where the microprocessor is further configured to provide power to selected power gates having the same group index within the partition in a predetermined sequence according to the zone index for the selected power gates.

18. The microprocessor of claim 16, where each power gate zone further includes one or more early power gate zones and one or more late power gate zones, the early power gate zones being assigned zone indices that are lower than zone indices assigned to the late power gate zones.

19. The microprocessor of claim 15, further comprising memory for storing an identity of the first power gate group.

* * * * *